United States Patent [19]

Moore et al.

[11] Patent Number: 5,219,404
[45] Date of Patent: Jun. 15, 1993

[54] LEAD CONDITIONER FOR QUAD SEMICONDUCTOR PACKAGES

[75] Inventors: Troy D. Moore, Garland; Joseph S. Antao, Plano; James E. Loveless, Carrollton; Dennis M. Botkin, Seagoville; Michael D. Glucksman, Dallas; Thomas J. Difloria, Allen, all of Tex.

[73] Assignee: Texas Instruments Incorporated, Dallas, Tex.

[21] Appl. No.: 702,983

[22] Filed: May 20, 1991

[51] Int. Cl.⁵ ............................................. B21F 1/02
[52] U.S. Cl. ................................................. 140/147
[58] Field of Search ..................... 140/105, 140, 147

[56] References Cited

U.S. PATENT DOCUMENTS

| | | | |
|---|---|---|---|
| 3,857,420 | 12/1974 | Newman | 140/105 |
| 4,633,920 | 1/1987 | Donovan et al. | 140/105 |
| 4,691,747 | 9/1987 | Sokolovsky | 140/147 |
| 4,765,376 | 8/1988 | Leiwe | 140/147 |

FOREIGN PATENT DOCUMENTS

162519  6/1989  Japan ............................. 140/147

*Primary Examiner*—Lowell A. Larson
*Attorney, Agent, or Firm*—Stanton C. Braden; Richard L. Donaldson

[57] ABSTRACT

A lead conditioning system (10) provides an offset conditioner (12), a planarity conditioner (14) and a tweeze conditioner station (16), a centering station (18), a transport assembly (20), a cabinet (22) having an input station (24) and an output station (26), and a control electronic control apparatus (28). Offset conditioner (12) conditions the offset spacing between leads of a gull-wing semiconductor device by shifting the leads axially in both directions and returning the leads to a center position according to a predetermined specification. Likewise, planarity conditioner station (14) deforms the leads of the semiconductor device so that the leads are essentially upright then repositions the leads by exerting forces downwardly on the tips of the leads so that the tips of the leads of the semiconductor device are essentially shifted to a coplanar position according to a predetermined specification. Offset conditioner (12) features a self-centering device with blades which accurately center the semiconductor device when the self-centering device is lowered thereover. Offset conditioner (12) also features a blade unit which is constructed with successive laminations of steel for enhanced strength and durability of the blades despite the thin width thereof.

11 Claims, 6 Drawing Sheets

LEAD CONDITIONER FOR QUAD SEMICONDUCTOR PACKAGES

BACKGROUND OF THE INVENTION

1. Field of the Invention

This invention relates to a machine and method used on semiconductor devices. More particularly, it relates to a machine which properly adjusts semiconductor device leads.

2. Description of the Prior Art

Unintended deformation of semiconductor leads is a well known problem in the semiconductor industry. Heretofore, this problem has been dealt with by manually manipulating leads back into the correct shape when deformation occurs. The problem with this method however, is that as lead pitch decreases manual adjustment becomes increasingly difficult. Moreover, as more and more of semiconductor device processing becomes automated, it becomes less efficient. That is to say, manual working and handling of semiconductor devices for lead deformation becomes less desirable.

One solution to this problem has been achieved by Texas Instruments Incorporated which has used a lead conditioning system for certain J-leaded devices such as PLCCs and SOJs. However, no method has heretofore been devised which can handle gull-wing packages, that is to say, devices having gull-wing leads on at least one side of the package. The above-mentioned Texas Instruments system conditions J-leaded devices utilizing a diagonal stroke of a blade unit enmeshed with the device leads. That is to say, the stroke is from one corner of a four-sided package to the opposite corner. In other words, one edge of the package defines an x axis and either adjacent edge defines a y axis. The stroke is along a line defined as equidistant between the x and y axes (i.e. 45 degrees).

Gull-wing type leads have heretofore proved more difficult because the lead tips are not fixed relative to the semiconductor device and therefore the lead tip positions are more easily manipulated and less secure. Therefore this stroke along the line 45 degrees between the x and y axes will not work for gull-wing devices. What is needed is a system capable of conditioning leads for a gull-wing semiconductor device.

SUMMARY OF THE INVENTION

The problems outlined above are in large measure solved by the apparatus and method in accordance with the present invention. That is to say, the invention hereof provides a process for conditioning semiconductor device leads so that the leads are within specification after processing. The lead conditioning system and associated method in accordance with the present invention include an offset conditioning station, a planarity conditioning station, a centering station, a transport assembly, and a cabinet having an input and output station, as well as electronic control apparatus. In one embodiment a tweeze conditioning station is also included in the system.

In this fashion the system conditions the lateral spacing (offset), the planarity of the lead tips and the tweeze characteristic (length from one tip to the tip of the opposite-facing lead) of a semiconductor device.

The invention provides a lead conditioning system adapted for use on a semiconductor package having a plurality of gull-wing leads presenting offset spacings therebetween, said system presenting a substantially upright z axis and x and y axes defining a plane substantially perpendicular to the z axis, said system further presenting a collective planarity, the planarity substantially characterized in or about the plane defined by the x and y axes, said system comprising:

a transport assembly suitable for conveying semiconductor packages;

an offset conditioner coupled to said transport assembly and suitable for correctly adjusting the offset spacing of the gull-wing leads;

a planarity conditioner coupled to said transport assembly and suitable for correctly adjusting the planarity of the quad-package leads; and an electronic controller coupled to and electronically controlling said transport assembly, said offset conditioner and said planarity conditioner so that said transport assembly is capable of conveying quad semiconductor packages to said offset conditioner and to said planarity conditioner and so that said offset conditioner and said planarity conditioner are capable of correctly adjusting the offset spacing and planarity spacing of the gull-wing leads.

DESCRIPTION OF THE PREFERRED EMBODIMENT

Figure 1:
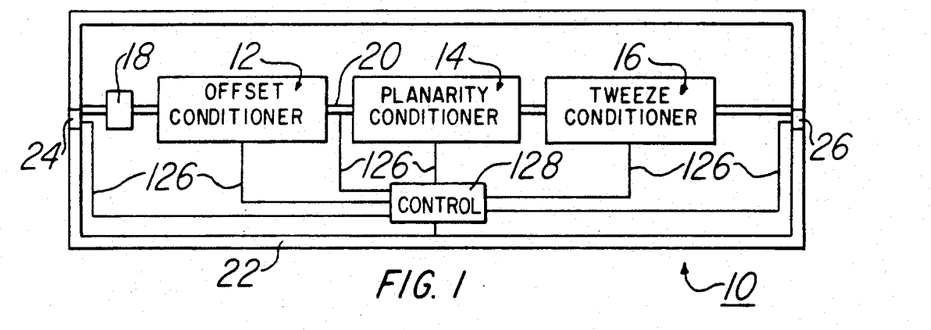
FIG. 1 is a schematic view of a lead conditioning system in accordance with the present invention.

Referring now to the drawings in general, and FIG. 1 in particular, a lead conditioning system 10 is shown schematically, having an offset conditioner station 12, a planarity conditioner station 14, a tweeze conditioner station 16, a centering station 18, a transport assembly 20, a cabinet 22 having an input station 24 and an output station 26, and an electronic control apparatus 28. System 10 conditions semiconductor package leads (which may or may not be deformed) to the correct spacing in terms of offset (lateral spacing), planarity and tweeze (spacing from tip of one lead to the tip of a lead directly opposite on the package).

Figure 2:
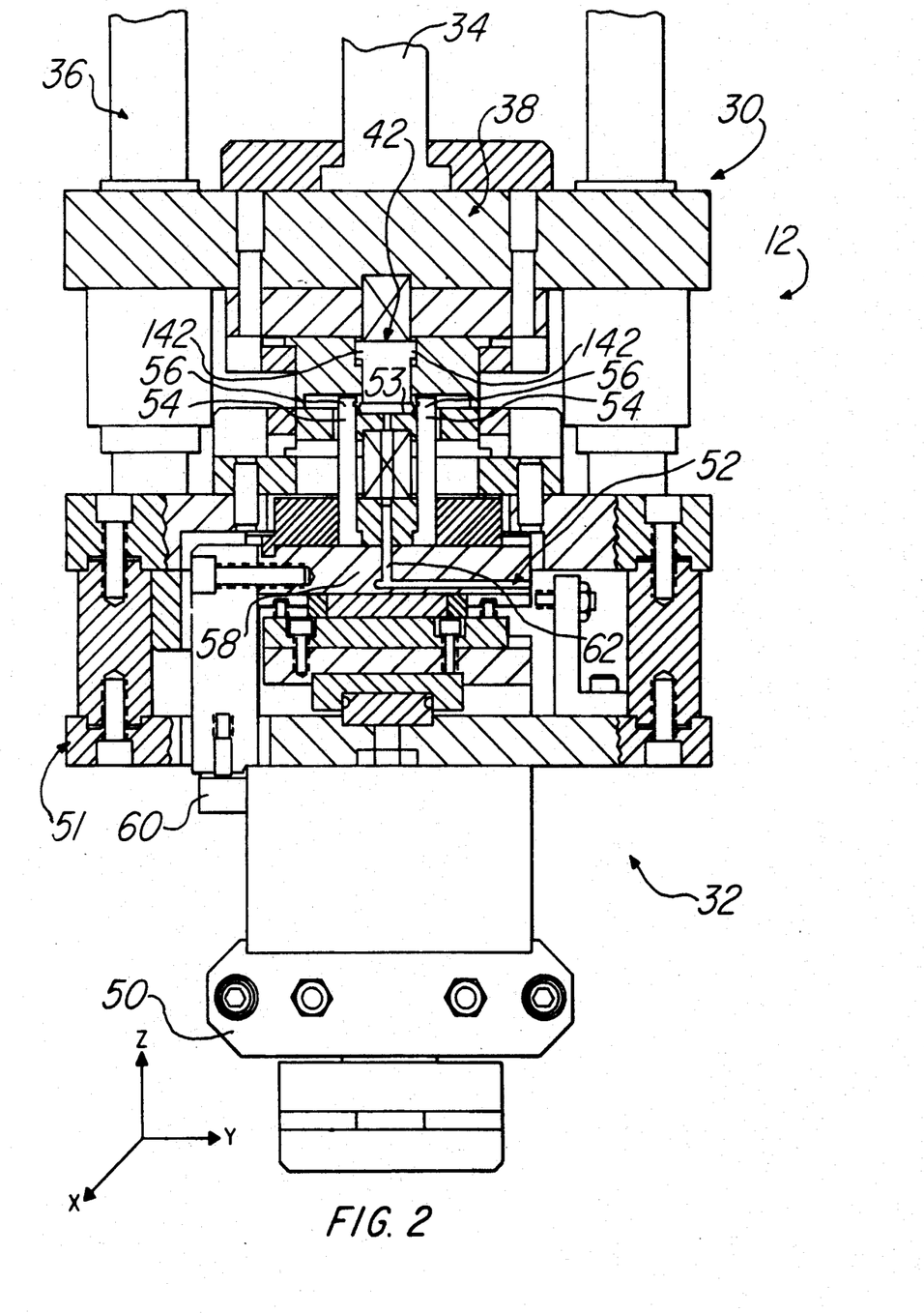
FIG. 2 is a partial, sectional view of an offset conditioner station of the lead conditioning system.

Referring now to FIG. 2, offset conditioner station 12 is partially shown in cross section. Station 12 is generally made of a durable metal such as steel, and has an upper die shoe 30 and a lower die shoe 32. Upper die shoe 30 has an engaging air cylinder 34 mounted thereon and includes a frame 36, engagement housing 38, and had a self-centering device (SCD) 40 mounted therein (SCD 40 is not shown in FIG. 2, see FIG. 9A).

Frame 36 is fixed with air cylinder 34 mounted thereon. Engagement housing 38 is downwardly shiftable from a spring-biased upward position to a lower, engaged position (wherein upper die shoe 30 engages lower die shoe 32). The engaged position is illustrated in FIG. 2.

Figure 9A:
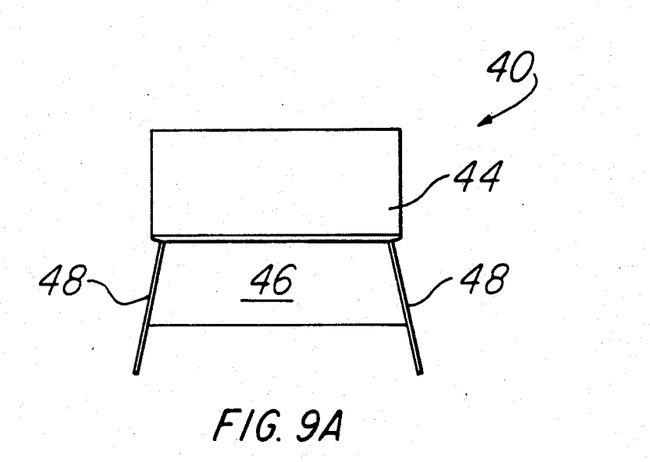
FIG. 9A is a partial, elevational view of a self-centering device of the offset conditioner station.
Figure 9B:
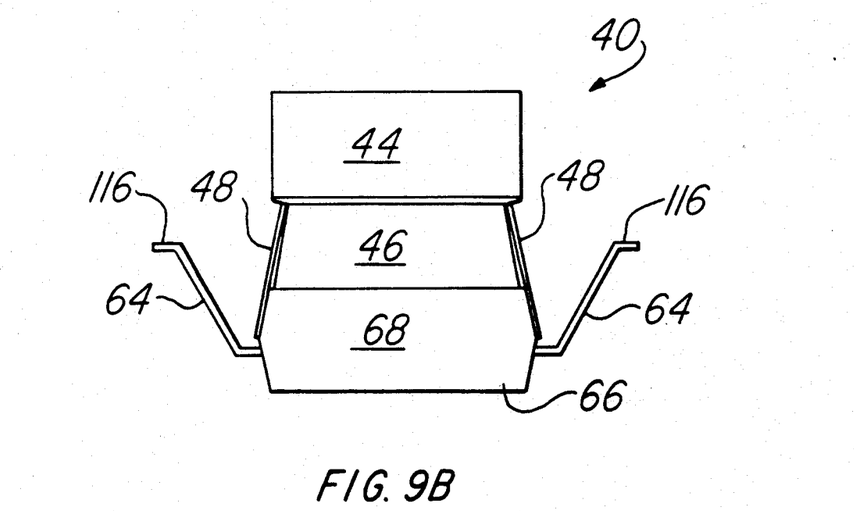
FIG. 9B is a partial, elevational view of the self-centering device of FIG. 9A engaging and centering a semiconductor device.

Referring to FIG. 9A, SCD 40 is removably secured to a lower surface 42 (see FIG. 2) of engagement housing 38. SCD 40 has a block 44, a solid, four-sided engagement tool 46 and four centering blades 48 (only two of which are shown in FIGS. 9A and 9B, a third blade which would normally be visible as shown and covering the visible side of engagement tool 46 is omitted for clarity of illustration). Blades 48 are secured to tool 40, one blade 48 corresponding to each side of tool 46. Blades 48 are made of resilient, flexible material such as shim stock. Blades 48 are reversibly flexible to an extended position as shown in FIG. 9B. The normal, nonextended position is shown in FIG. 9A.

Referring again to FIG. 2, lower die shoe 32 has a base 50, a frame 51, a vacuum assembly 52, a nest 53, four sets 54 of conditioner blades 56, a shiftable blade platform 58 and a cam assembly 60. Only two sets 54 of conditioner blades 56 are visible in FIG. 2. Blade platform 58 includes two precision slides respectively connected to first and second cam followers (not shown) which are part of cam assembly 60. Base 50 houses a large portion of cam assembly 60 (most of which is not visible in FIG. 2) and is secured to cabinet 22 by bolts or the like. Vacuum assembly 52 includes a vacuum cavity 62 and a vacuum generator, a vacuum sensor and tubing (not shown) for creating negative pressure in cavity 62.

Each set 54 of blades 56 is rigidly secured on blade platform 58. Blade platform 58 is coupled with cam assembly 60 and mounted on frame 51. Nest 53 is downwardly shiftable from a spring-biased, upper position relative to blades 56.

Figure 3A:
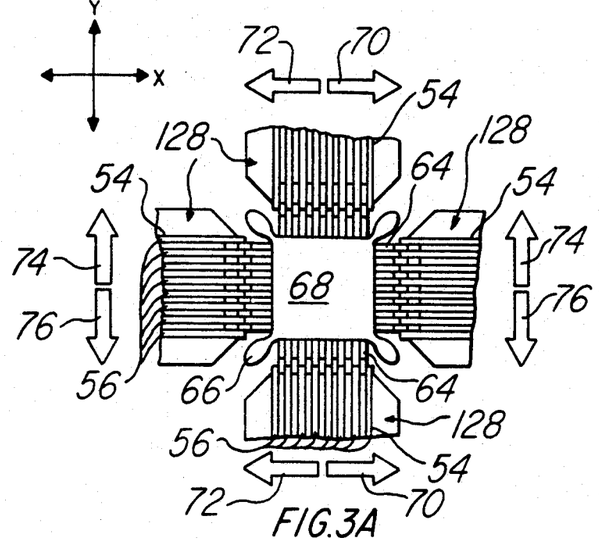
FIG. 3A is another partial, sectional view of the offset conditioner station with a quad semiconductor device mounted therein.
Figure 3B:
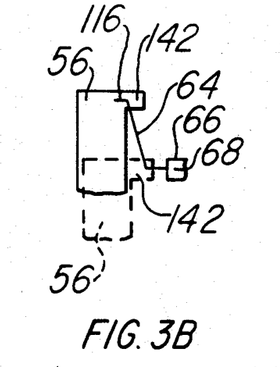
FIG. 3B shows a blade of the offset conditioner station both in phantom and full line relative to a portion of a semiconductor device.

Referring to FIG. 3A, the four sets 54 of conditioner blades 56 are shown enmeshed with gull-wing leads 64 of four-sided quad semiconductor package 66 which also has a body 68. In this particular example the quad semiconductor package 66 is a quad flat pack (QFP). FIG. 3B shows the lower position of one blade 56 in phantom (i.e. the blade platform 58 in the lower position) and also shows the upper position of one blade 56 relative to a gull-wing lead 64 of QFP 66.

Blade platform 58 (and therefore blades 56) are not only shiftable in the Z direction (note the orienting axes associated with FIG. 2), as shown in FIG. 3B, but also shiftably in the X-Y plane which is the view given in FIG. 3A. Blades 56 are shiftable in the X-Y plane due to actuation of cam assembly 60. Cam assembly 60 includes a cam, a first cam follower associated with positive and negative X axial shifting, and a second cam follower associated with positive and negative Y axial shifting. The arrows indicated by reference numerals 70 indicate positive X axis shifting in FIG. 3A while the arrows indicated by reference numerals 72 indicate negative X axial shifting. The arrows indicated by reference numerals 74 indicate positive Y axial shifting while the arrows indicated by reference numerals 76 indicate negative Y axial shifting. As viewed in FIG. 3A, blades 56 have an offset (i.e. lateral spacing) on the order of about 25 mils. however it will be readily appreciated that different devices have different lead pitches so that different blade spacings would be required for different devices. Hence each four sets of blades are custom designed for a given pitch and/or style of package. The offset spacing of blades 56 will be customized and designed for optimum enmeshment with the intended package. Blade platform 58 is mounted to be capable of shifting four sets 54 in positive and negative X and Y directions, usually on an order of between about 5 mils and about 30 mils shifting in either direction, depending on the package.

Figure 4:
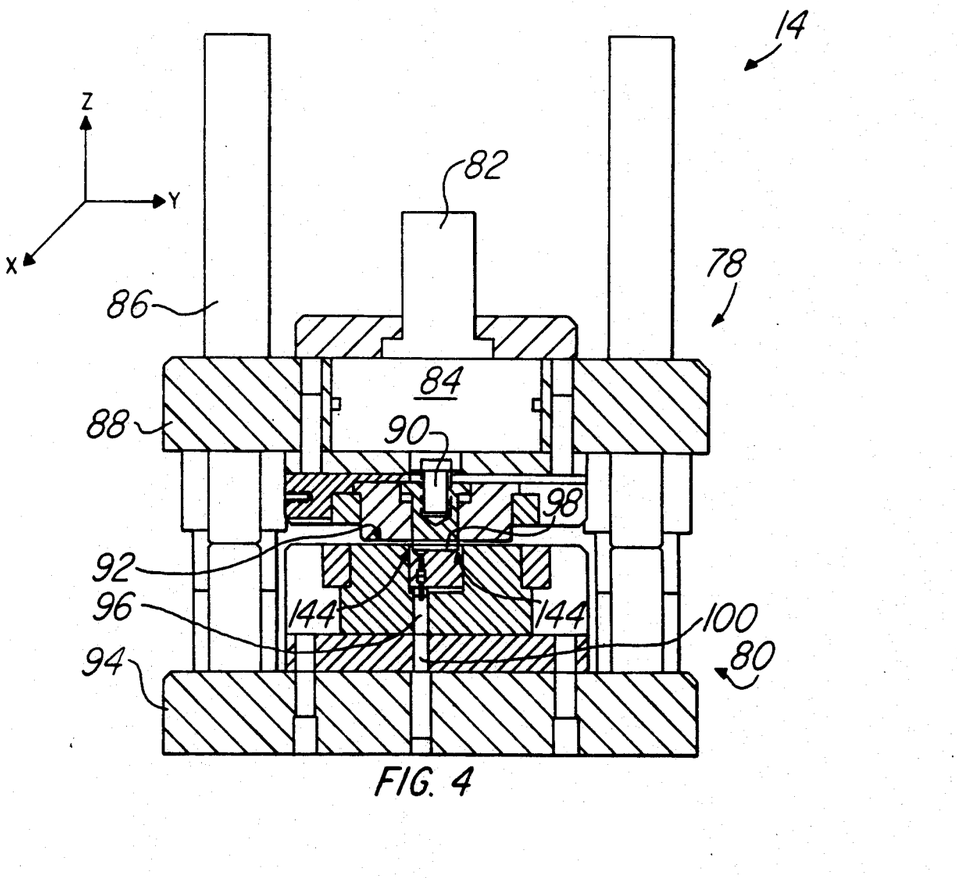
FIG. 4 is a sectional view of a planarity conditioner station of the lead conditioning system.

Referring now to FIG. 4, planarity conditioner station 14 includes upper shoe die 78 and lower shoe die 80. Upper shoe die 78 has an engaging air cylinder 82 and a working air cylinder 84 associated therewith and die 78 includes frame 86, engagement housing 88 and a plunger 90.

Figure 5A:
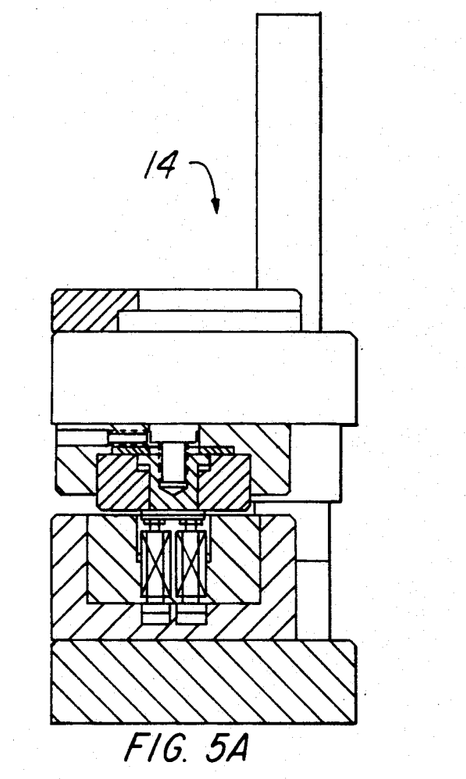
FIG. 5A is another sectional view, orthogonal to the view of FIG. 4, of the planarity conditioner station.

Frame 86 is fixed with engagement air cylinder 82 mounted thereon. Engagement housing 88 is shiftable from a spring-biased upward position to a lower, engaged position engaging the lower shoe die 80. The engaged position is shown in FIG. 4 (as well as FIG. 5A). Engagement housing 88 contains work air cylinder 84 and plunger 90 which is downwardly shiftable (i.e. in the Z direction) and spring-biased in the up position. Engagement housing 88 includes a flat, planarizing surface 92 on bottom portions thereof.

Lower shoe 80 has a frame 94, vacuum assembly 96, and a nest 98. Frame 94 is secured to cabinet 22 by bolts or the like. Vacuum assembly 96 includes a vacuum cavity 100 and a vacuum generator and tubing (not shown) for creating negative pressure in cavity 100. Nest 98 is spring-biased in lower shoe die 80 but is shown in the depressed position in FIGS. 4 and 5A.

Figure 6A:
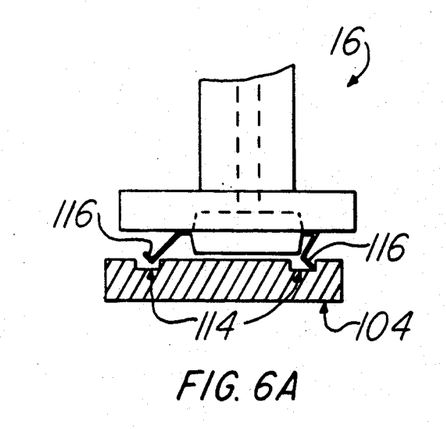
FIGS. 6A-6C are partial sectional views of a tweeze conditioner station of the lead conditioning system.
Figure 6B:
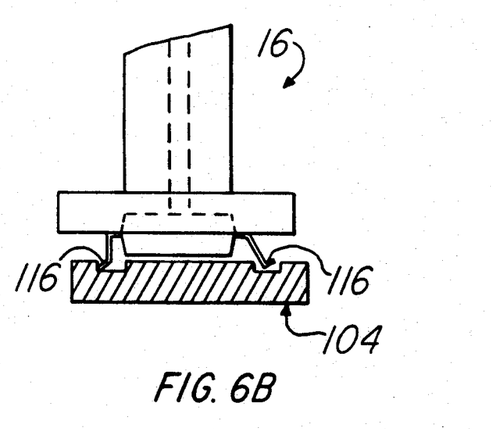
Figure 6C:
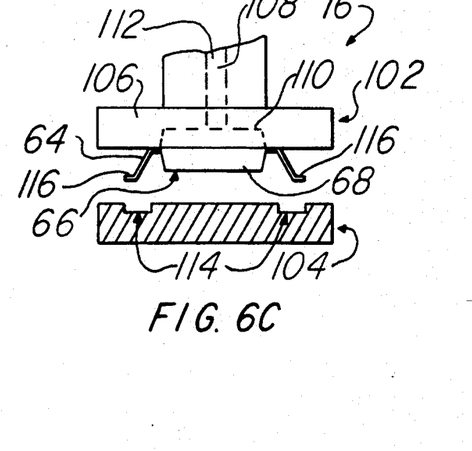

Referring now to FIG. 6C, tweeze conditioning station 16 is partially shown. Station 16 includes an upper die shoe 102 and a lower die shoe 104 only portions of each of which is shown. Upper die shoe 102 includes engagement housing 106 and vacuum assembly 108. Engagement housing 106 includes a recessed portion 110 shown in phantom which is suitable for partially containing a semiconductor package. Vacuum assembly 108 includes vacuum cavity 112 as well as a vacuum generator and tubing (not shown) for generating negative pressure in cavity 112. Lower die 104 includes recessed portions 114 having dimensions suitable for containing tips 116 of leads 64 of device 66. Tweeze conditioning system 16 includes a frame and engagement air cylinder in a fashion strictly analogous with stations 12 and 14 although these components are not shown. Likewise, tweeze conditioning station 16 is bolted to cabinet 22 or the like. Lower die shoe 104 is shiftable in the positive and negative X and Y axial directions in an analogous fashion to blade platform 58 of offset conditioner 12. Although device 66 and portions 114 are shown as being two-sided, it will be readily appreciated that is strictly for clarity of illustration and in fact device 66 has leads 64 on all four sides and station 16 has four corresponding sets of recessed portions 114.

Figure 8:
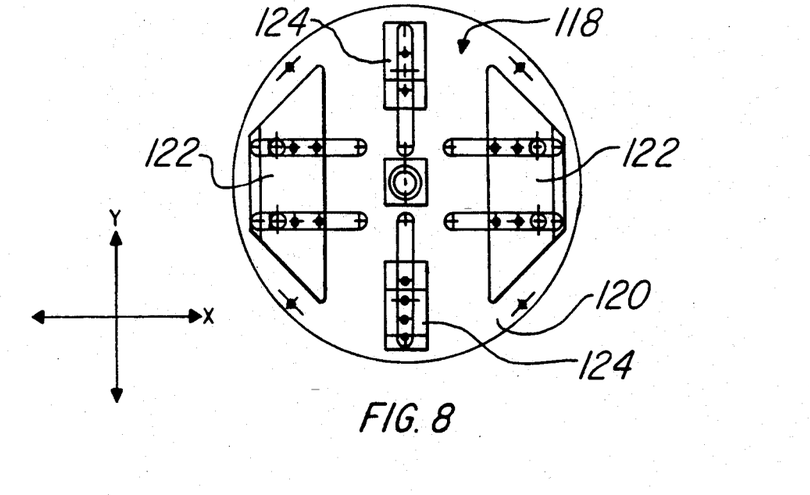
FIG. 8 is centering precisor of the lead conditioner system.

Referring to FIG. 8, portions of centering station 18 are shown from above. In this particular embodiment, centering station 18 includes a precisor assembly 118.

Precisor 118 has a base 120, slides 122 and slides 124. Slides 122 are shiftable in the positive and negative X direction, the X and Y axes being indicated again in FIG. 8, the base 120 of precisor 118 being oriented in the X-Y plane. Slides 124 are axially shiftable in the positive and negative Y directions.

Centering station 18 can be any station which relatively precisely locates device 66 prior to its transfer to nest 53, such centering stations usually being customized nests in the prior art. However, centering station 18 in the preferred embodiment is precisor 118.

In the prior art, precisors and nests have had to be designed to match the particular device to be handled. The design and manufacture of the nests is time consuming and expensive. The preferred precisor 118 is adjustable and yet serves as a nest. Precisor 118 uses two rack and pinion mechanisms, (one for each axis), to move slides 122, 124 in to close upon device 66. The rack and pinions keep device 66 centered. The axes are independent so that centering station 28 can handle rectangular devices. The prior art designs require that some clearance be left in the machined precisor to insure that the devices fit in the precisor. If the devices do not fit in the precisor correctly, they have to be reworked. Precisor 118 can be adjusted to precisely fit device 66. If device 66 does not fit properly in the preferred precisor 118, then precisor 118 only needs to be readjusted, not reworked. Readjustment can be accomplished by a technician or operator. The lead inspection system 10 can work with the prior art machined precisor/nests or the preferred centering station 28.

Referring once again to FIG. 1, transport assembly 20 is an automated, tray-to-tray apparatus which includes structures suitable for automated conveyance of devices 66 from input station 24 (and any other stations appropriate on cabinet 22) to centering station 18, to offset conditioner station 12, to planarity condition station 14, to tweeze conditioner station 16, to output station 26. Indeed, the transport assembly could be automated to the point of introducing devices 66 into input station 24 and out of output station 26 if desired. Such assemblies as transport assembly 20 are well understood in the art and therefore will not be described in greater detail.

Cabinet 22 is conventional in nature and is primarily a housing for system 10 and well as providing physical support for the various stations and protection from the environment. Cabinet 22 may have individual compartments for storing different components of system 10, such as a compartment for electronic control apparatus 28.

Control apparatus 28 is conventional in nature and can be a computer or microprocessor with the appropriate connective circuitry to the various stations as indicated schematically by reference numerals 126 in FIG. 1.

Figure 7A:
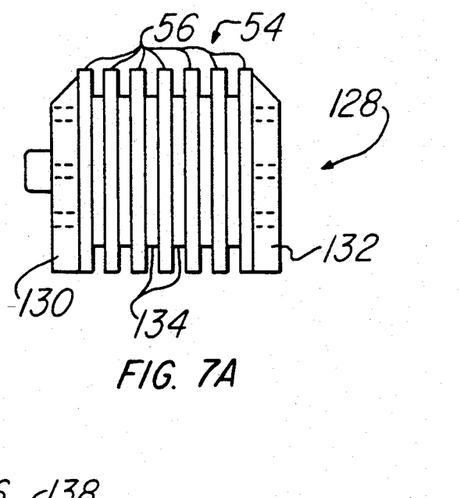
FIG. 7A is a blade unit of the lead conditioning station.

Referring to FIG. 7A, a preferred embodiment of the invention has a lower die shoe 32 including a blade unit 128 having a blade set 54 with a plurality of blades 56 and housing elements 130 and 132. Spacing elements 134 are disposed between blades 56 to achieve the appropriate spacing. In the preferred embodiment four such blade units 128 are mounted on blade platform 58.

Figure 7B:
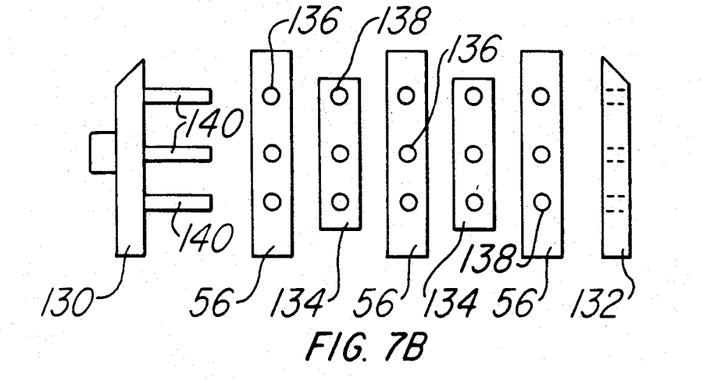
FIG. 7B is an exploded view of the blade unit of FIG. 7A.

FIG. 7B is an exploded view of blade unit 128 showing a few of the individual blades 56 and spacing elements 134. Blades 56 and spacing elements 132 have respective apertures 136 and 138 which are appropriately sized for rods 140 of housing element 130. Those skilled in the art will readily appreciate that alternatively, the blade unit could be a one-piece, integral design but such a unit would forego the benefits (such as blade strength) characteristic of laminated blade unit 128.

Referring once again to FIG. 1, the process of conditioning semiconductor leads will now be described. First one or more devices 66 (typically a large number to take advantage of the automated process) is introduced into system 10 at input station 24. Alternatively, devices having gull-wing leads on more or less than four-sides (e.g. two sides) would be utilized. Devices 66 are successively engaged by transport assembly 20 and conveyed to centering station 18 where a gross centering adjustment is made. This adjustment is made on the order of about 5 mils accuracy to insure proper placement in nest 53. Device 66 is then transported to offset conditioner 12 where the lateral spacing between leads 64 is adjusted to a predetermined specification. Device 66 is then transported to planarity conditioner station 14 where the tips 116 on leads 64 on all four sides of device 66 are planarized according to a predetermined specification. Device 66 is then transported by transport assembly 20 to tweeze conditioner station 16 where the tip-to-tip length of device 66 is adjusted according to a predetermined specification. Transport assembly 20 then transports device 66 to output station 26 where it is available for further processing. All of the above processing is coordinated and controlled by control station 28 as is well understood in the art.

The process of conditioning the leads of device 66 will now be discussed in greater detail. When device 66 arrives at input station 24 it is vacuum engaged by one of a plurality of elements of transport assembly 20, there being a number of other equally spaced such elements adapted for integrated conveyance of a plurality of devices 66 from station-to-station within system 10. When device 66 is transported from centering station 18 to offset conditioner 12 it is brought to rest in nest 53. Engagement air cylinder 34 is then actuated lowering engagement housing 38 to the position shown in FIG. 2. When engagement housing 38 is lowered, SCD 40 (which is located in cavity 142) is lowered onto device 66.

Referring to FIG. 9B, SCD 40 is shown engaged with device 66 as occurs with the actuation of air cylinder 34. The effective length of body 68 is slightly greater than that of engagement tool 46, thus centering blades 48 are pushed out to the extended position as shown. Note again that a blade 48 actually covers the visible portion of block 46, such blade 48 being omitted from FIG. 9B only for clarity of illustration.

In this fashion, device 66 is precisely centered so that the proper and accurate enmeshment of blades 54 with leads 64 is ultimately assured. It is advantageous to use the surface of device 66 as shown for engaging engagement tool 46 because of the way most plastic packages are molded: during the molding operation, the lead frame is located on the lower half of the mold which typically contains the cavities for the bottom half of the package. Because of this arrangement, the locational accuracy of the bottom portion of the package relative to the leads, is twice that of the top portion.

Referring once again to FIG. 3B, the blade 56 shown in phantom illustrates the initial position of blade 56 relative to device 66 after engagement air cylinder 34 is actuated so that engagement housing 38 is lowered and SCD 40 precisely centers device 66. Vacuum assembly 52 is actuated to sense device 66 and further secure device 66 in nest 53.

As housing 38 is lowered, SCD 40 pushes nest 53 down relative to blade units 128. The four blade units 128 are located in the center position (as shown in FIG. 3A) and are located such that there is one blade unit 128 on each side of device 66. The four blade units 128 are integrally connected and mounted on blade platform 58.

As nest 53 moves downward towards the lower position, leads 64 of device 66 enmesh with blades 56. By the time nest 53 has arrived at the lower position, leads 64 have fully enmeshed with blades 56 (as shown in the full line drawing of FIG. 3B) and have thereby completed the coarse phase of offset conditioning.

Blade units 128 are designed so that the first possible contact with a bent lead will be as close as possible to package body 68. By first combing through leads 64 near package body 68, blades 56 can fit between bent leads rather than directly under them.

The translation of blade units 128 on the x and y axes is controlled by a cam which rotates through 180 degrees after housing 38 is lowered. Each precision slide has its own cam follower and blade units 128 are moved along only one axis at a time. The precise movement of blade units 128 along the slides does the fine phase of the lead conditioning by sweeping leads 64 back and forth. After leads 64 have been conditioned, blade units 128 are returned to the central position before housing 38 is raised to its original position.

Since the profile on the cam is described in less than 90 degrees, the exact same profile is used for both axes. This arrangement yields a consistent process which contains no adjustments. Various lead geometries and lead materials can be accommodated by simply changing out the cam.

Referring to FIG. 3B in more detail, it will be noted that a wing portion 142 of blade 56 first becomes inserted between leads 64. Since wing portion 142 is closer to device 66, the separation of any deformed leads 64 is more readily assured since less deformation is likely to occur in leads 64 at the portions close to body 68. Thus, as blade 56 is shifted upward relative to device 66 ultimately only the tip 116 of lead 64 overlaps the profile of blade 56, namely at or about the wing portion 142. Leads 64 and blades 56 are thus accurately and effectively enmeshed. All four sets 54 of blades 56 are then shifted each in turn first in the positive X direction and then the negative X direction and then the positive Y direction and then the negative Y direction. It will readily be appreciated that by reference to FIG. 3A that the positive and negative shifting in the X direction of blade sets 54 is of effective benefit to only the upper and lower sets of leads 64 while the positive and negative Y shifting of all four sets 54 of blades 56 only benefits the left hand and right hand sets of leads 64. Yet, all four sets 54 are shifted in all four directions because the platform 58 can be integrally coupled with all four sets 54 of blades 56 in the most convenient and manufacturable fashion. Once the shifting in the positive and negative X and Y directions has been performed to a predetermined extent, the appropriate offset spacings of leads 64 are thereby achieved.

The pressure in air cylinder 34 is released so that engagement housing 38 is upwardly shifted into its normally upward biased position. Nest 53 also then returns to its normally upward biased position and transport assembly 20 then transports the offset conditioned device 66 to planarity conditioner station 14. Although the offset spacing of leads 64 is now adjusted so as to be correct at a predetermined specification, the coplanarity of tips 116 may still not be according to specification.

Referring now to FIG. 4, transport assembly 20 conveys device 66 to nest 98. (It will be noted that once SCD 40 has been utilized at offset conditioner station 12, device 66 is then satisfactorily located throughout the rest of the conditioning process.) Engagement air cylinder 82 is then actuated lowering engagement housing 88 to the downward engaged position securing device 66 in nest 98. Vacuum assembly 96 is actuated to further secure device 66 in nest 98. Working air cylinder 84 is then actuated so as to shift plunger 90 to its lower position which depresses nest 98 and device 66 downward. Leads 64 are thereby deformed into an essentially upright position by this action because they are engaged with guide portions of frame 86 as indicated by reference numerals 144. Guide portions 144 are preferably polished and plated with a friction-reducing material such as "NEDOX" or the like. NEDOX is a trademark of General Magnaplate Corp. NEDOX is available from American Magnaplate of Grand Prairie, Tex.

Figure 5B:
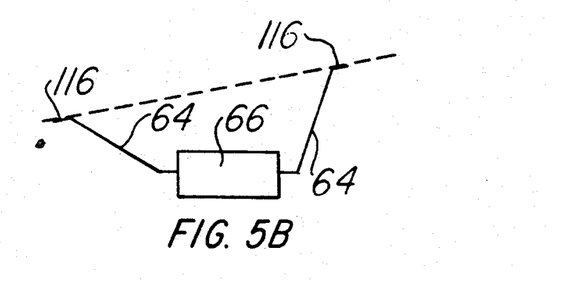
FIGS. 5B-5D are various elevational profiles of a semiconductor device
Figure 5C:
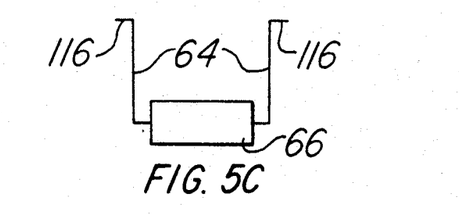

In this fashion, the profile of lead 64 is brought to a position schematically shown in FIG. 5C. The deformed planarity of device 66 is represented by possible deformation as illustrated in FIG. 5B where the plane defined by tips 116 of leads 64 is clearly not parallel with a horizontal X-Y plane which is the desired planarity in this orientation. While the profile of leads 64 and tips 116 present a horizontal plane (in FIG. 5C), the effective vertical length of lead 64 is too high, that is to say the gull shape has been destroyed by the downward action of plunger 90. Thus further processing is required.

Figure 5D:
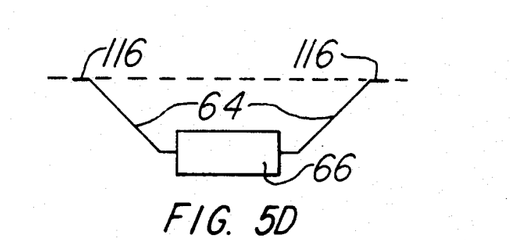

The process of actuating working cylinder 84 is reversed so that plunger 90 is returned to its upward, spring-biased position and since mechanical pressure on device 66 and nest 98 is relieved, spring-biased nest 98 returns to its upward position. This upward stroke of nest 98 results in tips 116 abutting the planarizing surface 92 of frame 86. Since the upward position of nest 98 relative to planarizing surface 92 is predetermined for a given device 66, the tips 116 experience appropriate forces so that leads 64 are returned to the appropriate effective height and profile and thus leads 64 of device 66 are appropriately planarized so that tips 116 exhibit the proper coplanarity as illustrated in FIG. 5D. It has been observed that planarizing conditioning corrects a substantial amount of deformation not corrected by offset conditioning and thus it is preferred that planarizing conditioning be performed after offset conditioning.

After the planarity process has been performed at planarity condition station 14, device 66 is then transferred to tweeze conditioner 16. Referring to FIGS. 6A-6C, device 66 is transferred to tweeze conditioning station 16 where it is engaged by engagement housing 106 in a fashion strictly analogous to that of the process for offset conditioning station 12 and planarizing conditioning station 14. Engagement housing 106 forces device 66 against lower shoe die 104 so that tips 116 as well as other portions of lead 64 are effectively secured in the X-Y plane (up in FIG. 6A-6C is the positive Z direction). The lower die shoe 104 is then shifted to the left to achieve the orientation shown in FIG. 6A. Then, the lower die shoe 104 is shifted to the left as shown in FIG. 6B. Then the lower die shoe 104 is shifted back to the center position as shown in FIG. 6C and the motion of engagement housing 106 is reversed from the actuating motion so that device 66 is lifted up as illustrated in FIG. 6C. Device 66 is held in place relative to engagement housing 106 by the vacuum action of vacuum assembly 108 during the entire process. This completes the tweeze process and it should be noted that only two sides of the leads (i.e. left and right as viewed in FIG. 6A–6C) are shown but it will readily be understood that there are leads on all four sides of the device and that lower shoe die 104 is also equipped with recessed portions 114 both into and out of the plane of the page as viewed in FIG. 6A–6C and that motion conditioning the tweeze in this direction is also performed.

The leads of device 66 are thus brought within specification (e.g. JEDEC and/or EIAJ) for all of the predetermined characteristics, namely offset, planarity and tweeze. Device 66 is then transported by transport assembly 20 to output station 26 from which it can be transported to other processing as desired. It should be noted that in certain processes the tweeze conditioning may not be necessary or desirable, in which case system 10 could omit the tweeze conditioner station 16 altogether so that the system essentially performed only the functions of offset conditioning and planarity conditioning.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

We claim:

1. A lead conditioning system adapted for use on a semiconductor package having a plurality of gull-wing leads presenting offset spacings therebetween, said system presenting a substantially upright z axis and x and y axes defining a plane substantially perpendicular to the z axis, said system further presenting a collective planarity, the planarity substantially characterized in or about the plane defined by the x and y axes, said system comprising:
    a transport assembly suitable for conveying quad semiconductor packages;
    an offset conditioner coupled to said transport assembly and suitable for correctly adjusting the offset spacing of the gull-wing leads;
    a planarity conditioner coupled to said transport assembly and suitable for correctly adjusting the planarity of the gull-wing leads; and
    an electronic controller coupled to and electronically controlling said transport assembly, said offset conditioner and said planarity conditioner so that said transport assembly is capable of conveying quad semiconductor packages to said offset conditioner and to said planarity conditioner and so that said offset conditioner and said planarity conditioner are capable of correctly adjusting the offset spacing and planarity spacing of the gull-wing leads.

2. The lead conditioning system of claim 1, wherein said system is adapted for use on a semiconductor package having a plurality of gull-wing leads on two sides of the package.

3. The lead conditioning system of claim 1, wherein said system is adapted for use on a semiconductor package having a plurality of gull-wing leads on four sides of the package.

4. The lead conditioning system of claim 1, further comprising:
    a tweeze conditioner coupled to said transport assembly and suitable for correctly adjusting the tweeze of the quad-package leads.

5. An offset conditioner for correctly positioning quad-package leads, said conditioner presenting a substantially upright z axis and x and y axes defining a plane substantially perpendicular to the z axis, said offset conditioner comprising:
    a nest;
    a straightening die operatively coupled with and shiftable on either the x or y axis relative to said nest, said die having four sets of blades suitable for enmeshment with the quad leads; and
    a cam operatively coupled with said die for shifting thereof on either the x or y axis relative to said nest.

6. The offset conditioner of claim 5 wherein said nest is upwardly spring-biased and downwardly shiftable relative to said blades.

7. A planarity conditioner for correctly positioning quad-package leads, said planarity conditioner comprising:
    a lower shoe die including a nest and a frame,
        said frame including fixed straightening portions surrounding said nest, said nest downwardly shiftable and upwardly spring-biased;
    an upper shoe die operatively coupled with said lower shoe die and including an upwardly-biased plunger and a planarizing surface,
        said plunger downwardly shiftable relative to said frame; and
    a working air cylinder coupled with said plunger.

8. A lead conditioning system adapted for use on a quad semiconductor package having a plurality of quad-package leads presenting offset spacings therebetween, said system presenting a substantially upright z axis and x and y axes defining a plane substantially perpendicular to the z axis, said system further presenting a collective planarity, the planarity substantially characterized in or about the plane defined by the x and y axes, said system comprising:
    a transport assembly suitable for conveying quad semiconductor packages;
    an offset conditioner coupled to said transport assembly, said offset conditioner including—
        a nest,
        a straightening die operatively coupled with and shiftable on either the x or y axis relative to said nest, said die having four sets of blades suitable for enmeshment with the quad leads, and
        a cam operatively coupled with said die for shifting thereof on either the x or y axis relative to said nest;
    a planarity conditioner coupled to said transport assembly, said planarity conditioner including—
        a lower shoe die including a nest and a frame,
            said frame including fixed straightening portions surrounding said nest, said nest downwardly shiftable and upwardly spring-biased,
        an upper shoe die operatively coupled with said lower shoe die and including an upwardly-biased plunger and a planarizing surface, said plunger downwardly shiftable relative to said frame, and a working air cylinder coupled with said plunger;

an electronic controller coupled to and electronically controlling said transport assembly, said offset conditioner and said planarity conditioner so that said transport assembly is capable of conveying quad semiconductor packages to said offset conditioner and to said planarity conditioner and so that said offset conditioner and said planarity conditioner are capable of correctly adjusting the offset spacing and planarity spacing of the quad-package leads.

9. A method of conditioning a quad semiconductor package having a plurality of quad-package leads presenting offset spacings therebetween said method comprising the steps of:

providing a blade unit having four sets of blades suitable for enmeshment with the quad leads, said blade unit presenting an x-y plane and a center position therein;

enmeshing said blades with the leads;

shifting said blades in all four directions of the x-y plane and returning to the center position so as to cause the leads to be shifted and returned to the center position whereby the offset spacing of the leads conforms to a predetermined specification.

10. A method for accurately centering semiconductor devices, said method comprising the steps of:

providing a self centering device having— an engagement tool presenting a length slightly less than the length of the semiconductor device, and a plurality of centering blades, each respectively, extendibly fixed to said side of said engagement tool, said blades extending downwardly below said lower surface of said centering tool;

engaging said lower surface of said centering tool with the upper surface of the body of the device, so that said blades are shifted to said extended position, whereby said blades center the device.

11. A method of conditioning a quad semiconductor package having a plurality of quad-package leads presenting offset spacings and a planarity therebetween, said method comprising the steps of:

providing a blade unit having four sets of blades suitable for enmeshment with the quad leads, said blade unit presenting an x-y plane and a center position therein;

enmeshing said blades with the leads;

shifting said blades in all four directions of the x-y plane and returning to the center position so as to cause the leads to be shifted whereby the offset spacing of the leads conforms to a predetermined specification;

manipulating the package so that the leads present an essentially upright profile; and depressing the tips of the leads so that the leads present an oblique-angle profile and the lead tips are essentially coplanar.

* * * * *